(12) United States Patent
Peloza et al.

(10) Patent No.: US 7,815,475 B2
(45) Date of Patent: Oct. 19, 2010

(54) THREE-DIMENSIONAL PLATED SUPPORT FRAME

(75) Inventors: Kirk B. Peloza, Naperville, IL (US); Victor Zaderej, St. Charles, IL (US); John Dolaz, Spring Grove, IL (US); Stephen Rushing, Conway, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/340,144

(22) Filed: Dec. 19, 2008

(65) Prior Publication Data

US 2009/0163045 A1 Jun. 25, 2009

Related U.S. Application Data

(60) Provisional application No. 61/008,800, filed on Dec. 21, 2007.

(51) Int. Cl.
*H01R 13/02* (2006.01)
*H01R 9/24* (2006.01)

(52) U.S. Cl. ........................................ 439/886; 439/931

(58) Field of Classification Search .................. 439/55, 439/59, 78, 736, 931, 660, 886
See application file for complete search history.

(56) References Cited

U.S. PATENT DOCUMENTS 5,938,455 A * 8/1999 Glovatsky et al. ............. 439/74

| | | | | |
|---|---|---|---|---|
| 6,319,564 B1 * | 11/2001 | Naundorf et al. | ............. | 427/531 |
| 6,654,200 B1 * | 11/2003 | Alexander et al. | ....... | 360/97.01 |
| 6,696,173 B1 * | 2/2004 | Naundorf et al. | ............. | 428/621 |
| 6,839,199 B1 * | 1/2005 | Alexander et al. | ....... | 360/97.01 |
| 7,323,986 B2 * | 1/2008 | Hunter et al. | ............. | 340/545.6 |

FOREIGN PATENT DOCUMENTS

| EP | 1 217 807 A1 | 6/2002 |
|---|---|---|
| JP | 07-142108 | 6/1995 |
| JP | 7-142108 | * 6/1995 |

OTHER PUBLICATIONS

International Search Report for PCT/US2008/087749.

* cited by examiner

*Primary Examiner*—Javaid Nasri
(74) *Attorney, Agent, or Firm*—Stephen L. Sheldon

(57) ABSTRACT

A connector assembly of complex shape has a connector body with possesses a plurality of distinct surfaces both parallel and intersecting. Laser directed structuring is used to form patterns of conductive traces on the surfaces of the connector body and raised ribs are formed along the traces and interposed between them to form channels that encompass at least portions of the traces. The raised ribs increase the time in which plating solution can dwell over the laser excited areas and also form abrasion barriers to prevent abrasion for the conductive traces during the plating thereof.

23 Claims, 12 Drawing Sheets

THREE-DIMENSIONAL PLATED SUPPORT FRAME

REFERENCE TO RELATED APPLICATIONS

This application claims priority of U.S. Provisional Patent Application No. 61/008,800, filed Dec. 21, 2007, and which is incorporated in its entirety herein.

BACKGROUND OF THE INVENTION

The present invention relates generally to support frames used in hand-held electronic devices and the like, and more particularly to such a support frame that has one or more connector components and/or switches integrally formed therewith and in which the contacts, terminals and circuit traces used thereon are all formed by plating the support frame.

Numerous hand-held devices exist such as mobile telephones, test devise, medical meters and the like. The market in these products is expanding and the current trend in this market is toward reducing the size of these devices, reducing the cost of these devices and increasing the amount of functionality of these devices. With increased functionality, comes the possible need for interconnecting more components of the device together. This is challenging to do effectively because of the reduced size of these devices and the size constraints that accompany such small structures.

Medical devices, such as personal blood sugar, or glucose meters, are but one example of a device that now require increased functionality. A glucose meter, for example, requires a LCD viewing screen that is connected to a frame along with various switches and circuit boards. The circuit boards may contain blood analysis circuitry and be linked to a calibration and analysis components. Such meters are handheld and as such, their configuration is unique with steps, cradles and/or slopes for accommodating its components. Conventional meters require lengths of flexible printed circuitry to connect the viewing screen to the analysis circuit board and sometimes each particular function of the meter is accomplished by circuitry on separate and distinct circuit boards. In this instance, connectors need to be attached to the frame so that they may provide a connection between the circuit boards and the frame or other individual components. Separate connectors must be individually attached and their attachment and separate construction increase the cost of the frame of the meter.

The present invention is directed to a frame, or support for an electronic device that avoids these shortcomings and permits the reduction in size of the electronic device.

SUMMARY OF THE INVENTION

Accordingly, it is a general object of the present invention to provide a support frame for an electronic device that supports a display screen and which has one or more connectors and/or switches integrated into the support frame.

Another object of the present invention is to provide a support frame for use in an electronic device in which the support frame includes a configuration having multiple contoured surfaces thereon and at least one connector member formed as an integral part of the support frame, the support frame further including a plurality of conductive traces extending along the exterior surfaces of the support frame to provided connections between contacts, or termination points, on the support frame and the traces being formed on the surfaces thereof by plating selected portions of the frame.

A still further object of the present invention is to provide an integrated connector assembly that includes a support frame with a configuration having multiple distinct surfaces, the surfaces being disposed in multiple planes, parallel or transverse planes, and the surfaces including one or more connector members formed as part of the support frame and extending along the support frame, the connector assembly further including a plurality of conductive traces and contact portions disposed on the distinct surfaces and extending therealong to provide continuous, uninterrupted conductive paths from various points of connection on the support frame to the one connector.

Yet another object of the present invention is to provide a connector assembly of the type set forth above, wherein the paths of the conductive traces and contacts are marked on the surfaces of the support frame with a laser that is capable of tracing a complex path on the various surfaces of the support frame, the complex path being subsequently plated with a conductive material to define a plurality of conductive traces extending in complex paths upon the support frame.

Still yet another object of the present invention is to provide a connector structure in the form of a support frame for supporting electronic components, the frame having a nonplanar configuration with surfaces thereof extending in multiple planes, the surfaces including a plurality of conductive traces disposed thereon and extending along and through the different planes, thereby providing multiple points of connection between different locations on the support frame, the support frame including one or more connector components integrally formed with the support frame and the conductive traces extending through and within the connector component to provide multiple termination points within the connector component, the surfaces of the support frame further being etched or otherwise modified to create a series of channels in which the conductive traces extend, the channels protecting the conductive traces from abrasion and degradation during the plating process of the frame.

Yet another object of the present invention is to provide a terminal-less connector having a connector body that has a plurality of distinct surfaces extending in different planes, the connector having a plurality of conductive traces extending along the distinct surfaces and between two contact portions, the conductive traces being formed by imaging a pattern on the connector body with a laser to excite the material from which the connector body is made so that it may be plated, then immersing the connector body in a plating solution and agitating the solution so as to plate the laser-traced image on the connector body, the connector body further being formed with a plurality of raised ribs, the ribs defining a series of channels on at least one surface thereof, each of the channels encompassing a single conductive trace therein, the channels providing protection to the conductive traces from abrasion during the plating of the conductive traces and a retention for retaining plating fluid therein during the plating process.

Still yet another object of the present invention is to provide a connector of the type described above, wherein the connector body includes, in addition to the conductive traces, defined conductive pads that include one or more deposits of solder paste so as to permit soldering of components to the connector body and the connector body further includes a switch contact formed on the connector body, the switch contact including two contact portions positioned adjacent each other and in which one of the two contact portions extends through a recess disposed in the connector body.

Yet a still further object of the present invention is to provide a molded interconnect device that has a plurality for conductive traces formed on one or more surfaces of the device, the conductive traces also being utilized in a manner so as to form a switch for the device by positioning one conductive trave adjacent to a second conductive trace, the one and second traces being spaced closely apart from each other, the device having a recessed channel defined in a surface thereof that forms a pathway for the second conductive trace, the channels walls assisting in preventing of shorting the switch between its two traces.

And another object of the present invention is to provide such a switch in the form of a dome switch in which the one conductive trace defines an open circle and the second conductive trace defines a path into an interior of the one conductive trace, the channel walls providing a depression that routes the second conductive trace into the interior of the first conductive trace, the channel walls being configured with radiuses to deter plating deposits in areas other than those intended for plating, thereby reducing the likelihood of short circuits being formed as part of the switch during manufacture of the support frame.

The present invention accomplishes these and other objects and advantages by way of its unique structure. A connector assembly according to one embodiment of the present invention includes a molded support member, which may take the form of a frame upon which various electronic components are mounted. This frame has two surfaces and one of these surfaces serves as a support surface for conductive traces that interconnect various terminations points on the support member. This surface is a complex surface and it has a number of different planes, some spaced apart from each other at different elevations and others intersecting those planes. Conductive traces that are applied to this surface therefore follow a torturous path between their termination points.

The molded support member is subjected to laser excitement where the laser removes a small area of the surface of the support frame and renders the material plateable. With the use of a laser, very fine pitches of thin traces may be accomplished, currently possible down to 0.4 mm. The trace patterns may be complex and follow the contours of the many different surfaces. The use of the laser in this fashion is know as laser direct structuring ("LDS") and it dispenses with the need to use two-shot molding for a plated interconnect device as was required in the past.

The molded support member may further have connector housings and contact portions molded integrally therewith so as to integrate as many connector and connector-like components into the support frame structure to reduce the need to separately form and attach them to the support frame. Once the support frame is excited by the laser and the conductive trace pattern is formed, the support frame is immersed into an electroless plating solution and agitated so that the excited areas are plated with a conductive material that may include copper, nickel, palladium, silver and/or gold.

In order to ensure accurate deposits of the plating material and to prevent bleeding for the plating material between the finely spaced conductive traces, the support frame may be provided with a series of raised ribs, or barrier walls that are interposed between the paths of adjacent conductive traces. These ribs form, in effect, a series of channels which serve a twofold purpose. Firstly, the raised ribs serve as a collision barrier to prevent other parts in the agitated plating solution from colliding with the trace portions on the support frame, reducing or eliminating contact with the traces reduces the possibility that the traces may become abraded and ultimately degraded during the plating process. Secondly, the plating solution will tend to dwell a longer time in these channels during the plating process and ensure adherence of the plating material to the excited traces. The raised ribs not only protect the traces from abrasion, but are portions of the support frame intended to collide with other parts in the plating solution. Thus the agitation speed may be increased and there is little concern as to plating material depositing on the ribs for due to their height they are subject to abrasion which will reduce any likelihood of errant plating deposition thereon.

The use of LDS plating may be also used to create switch contacts on the device. One manner of a switch includes the deposition of two switch contacts, an outer and inner contact. The outer contact takes the form of an interrupted circle, i.e. a circle with a slot in it), and the inner contact extends into the interior of the circle via a channel that is formed into the support frame. The channel has two opposing walls that serve to prevent plating material from depositing in the areas between the inner and outer contacts.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which:

FIG. 5A is a diagrammatic, detailed view of a portion of FIG. 5, illustrating the recessed nature of the LCD mounting holes or vias formed in the support frame;

FIG. 6A is a diagrammatic view illustrating the multiple planes in which different and distinct surfaces of the support frame extend;

DETAILED DESCRIPTION OF THE PREFERRED EMBODIMENTS

Figure 1:
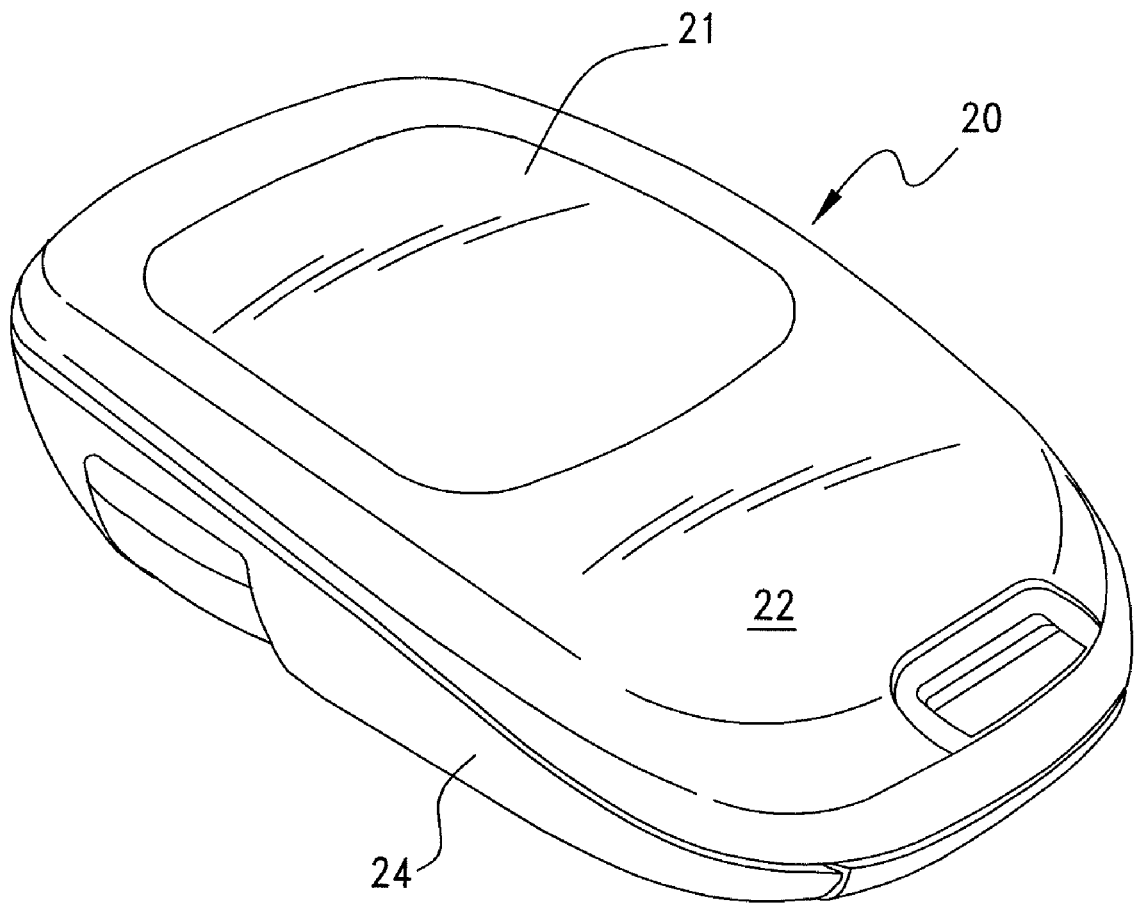
FIG. 1 is a perspective view of a hand held electronic device in which the present invention finds utility.

The present invention is directed to a support frame that integrates both conductive traces and connector elements into a single structure that has a plurality of distinct surfaces. As such, it shall be described herein in the context of one of its preferred embodiments, namely a connective assembly that takes the form of a support frame which is used to support a display component such as liquid-crystal display (LCD) panel and connect the display component to operational circuitry including circuit boards, capacitors, resistors, the like as well to as other electronic components. FIG. 1 shows a hand-held, pocket sized glucose meter 20 that is used by individuals, such as diabetics, to check their level of blood sugar. Although the present invention can be utilized in other such devices, the glucose meter 20 is used as an illustrative example of the size and space restrictions facing hand-held electronic equipment designers today. As such, it will be understood that the meter 20 is not the only device in which the present invention maybe be used.

The glucose monitor 20 shown is has a compact form factor with approximate dimensions of 2¾×1¾ inches (20×45 mm) and ¾ inches (18 mm) thick. With such a small size, there is only about 3.4 cubic inches of interior space in which to place electronic circuitry. Most of the exterior space of the device 20 is taken up by a display window 21 in which a user can read the quantitative analysis of his or her blood. As will be developed more further to follow, the present invention offers a product design with increased utilization of its enclosed, small interior spaces with more functional features.

Figure 2:
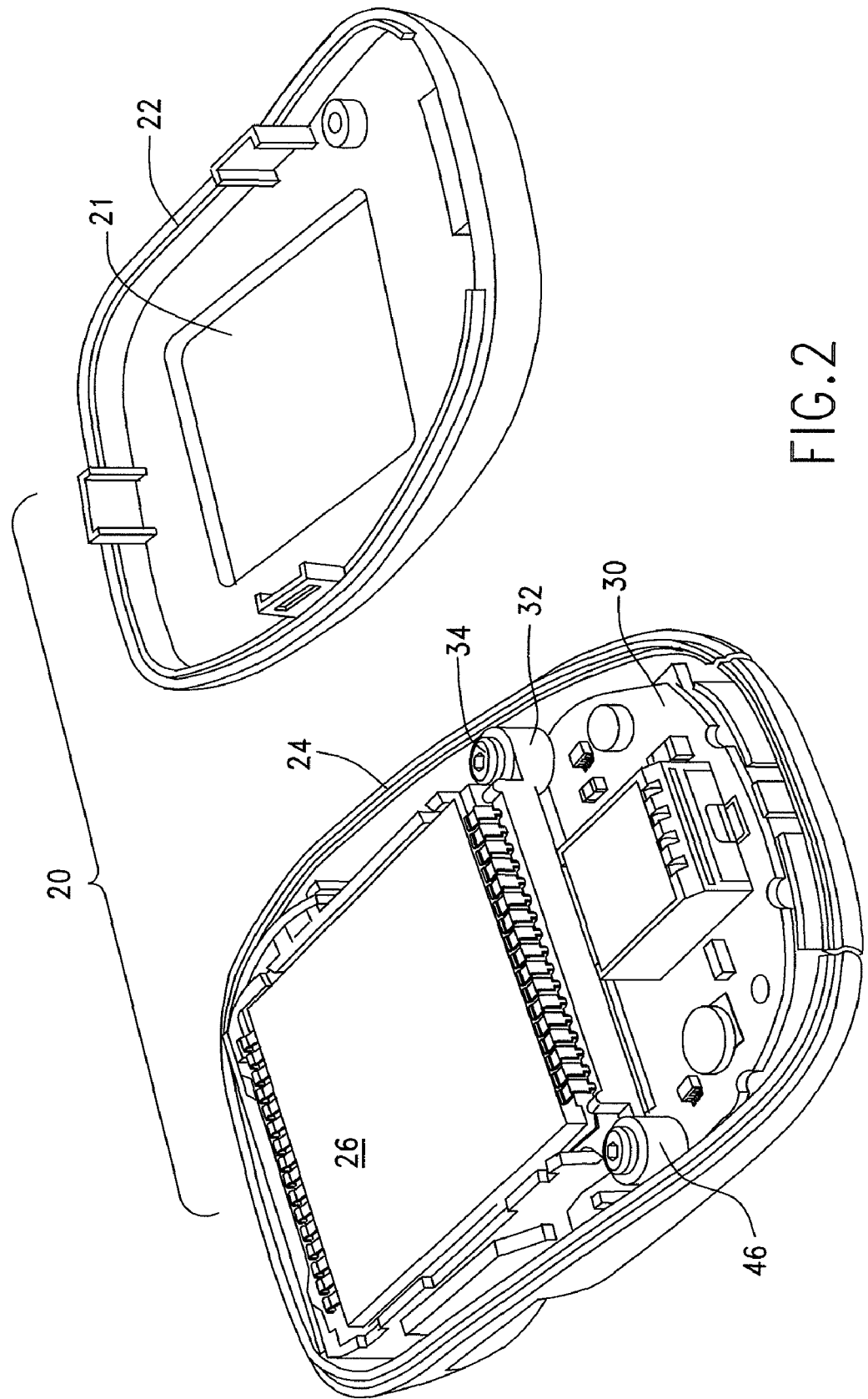
FIG. 2 is an exploded view of the device of FIG. 1 showing some of the internal circuitry and the LCD display screen.
Figure 3:
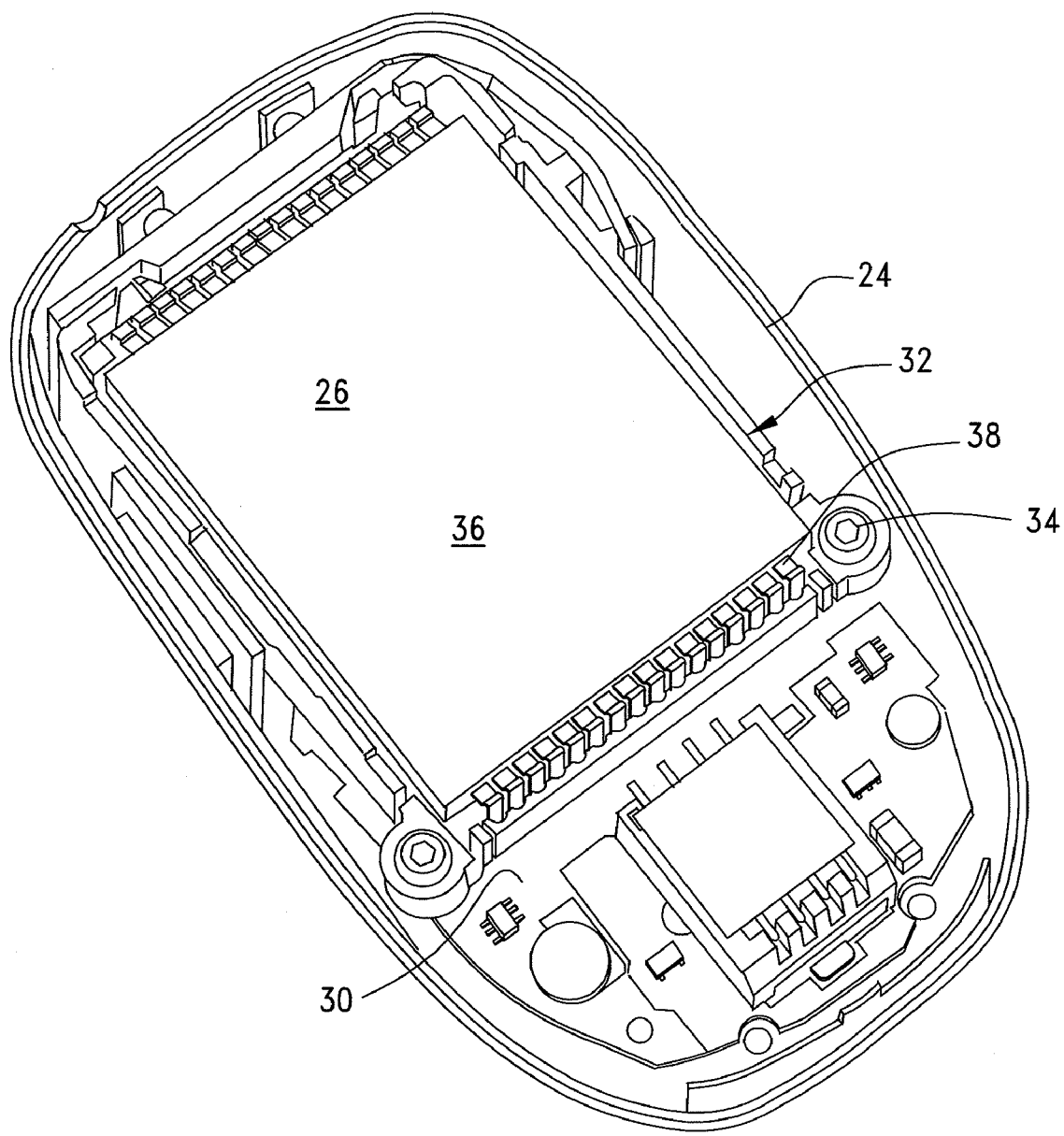
FIG. 3 is an angled overhead view of the open housing of the device of FIG. 1 showing the manner of mounting thereon a support frame of the present invention.

FIG. 2 shows the glucose monitor 20 with its top housing, or cover 22, removed to expose the interior components and circuitry to view. Within the lower housing 24, an LCD display element 26 is supported along with various electronic components 28 in the form of integrated circuits, resistors, capacitors, transistors and the like as well as the base circuit board 30. A support member, that is shown as a frame member 32, is mounted to the circuit board 30 by way of screws 34 or the like and the frame member supports the LCD display element 26, while also providing multiple points of connection. The display element 26 has a central body portion 36 that is used to display letters, numbers or other identifying indicia and the body portion 36 has a plurality of conductive leads 38, in the form of terminals or tails, that extend from opposing ends thereof for connection to circuits of the device. These tails 38 must be terminated to the various components on the circuit board. Mounting the LCD display element 26 directly to the circuit board 30 would occupy a large amount of space on the circuit board 30 and require a circuit board of a size that is larger than that shown in the drawings, resulting, of course, in an increased overall size of the device 20.

Figure 4:
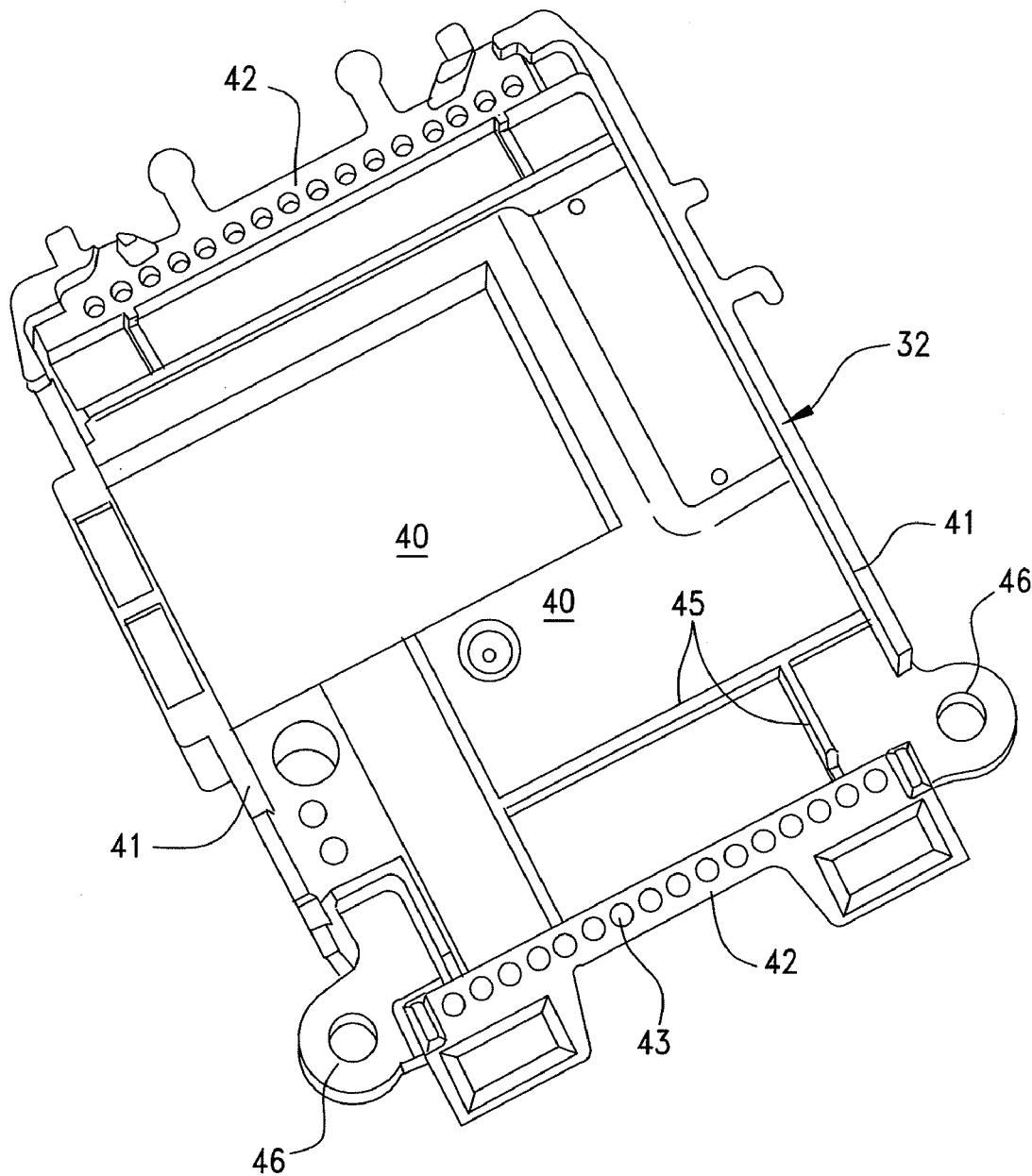
FIG. 4 is a perspective view, taken from above, of an electronic device support frame constructed in accordance with the principles of the present invention.

FIG. 4 illustrates a support frame 32 that forms a connector assembly constructed in accordance with the principles of the present invention. It is called a "support frame" herein because it generally provides support for the functional components that are used in the device. However, as explained in more detail to follow, it has conductive and non-conductive areas on it and therefore also provide a connector function. It is our intent that the terms "support frame" and connector assembly" are used interchangeably herein. The support frame may be preferably molded or otherwise formed from materials such as LCP ("liquid crystal polymer"), PPA ("Polyphthalamide") PC/ABS ("polycarbonate-Acrylonitrile Butadiene Styrene") and ABS ("Acrylonitrile Butadiene Styrene") and/or mixtures thereof. A catalyst is mixed in with these plastic resins, and the catalyst resides beneath the surface of the support frame. A laser is used to burn away a very slight amount of the surface of the support frame, i.e., "skin" and expose the catalyst embedded material which is plateable with electroless plating solutions.

The frame can be seen to include a base portion 40 that is bounded by one or more side walls 41, two end walls 42 are provided at opposite ends of the body portion 40. These endwalls 42 are provided with a plurality of slots or openings 43 that receive the tails of the display element. One or more openings 44, which as shown includes a plurality of edges 44a, may be provided in the base portion 40, and in the depicted embodiment permits connection between discrete components in the circuit board- and terminals on the display element. The support frame 32 may also include internal ribs 45 formed as part of the frame 32 to provide strength and resistance to bending. A pair of bosses 46 are preferably included as part of the frame 32 so that the frame may be easily mounted to a substrate such as the circuit board.

Figure 5:
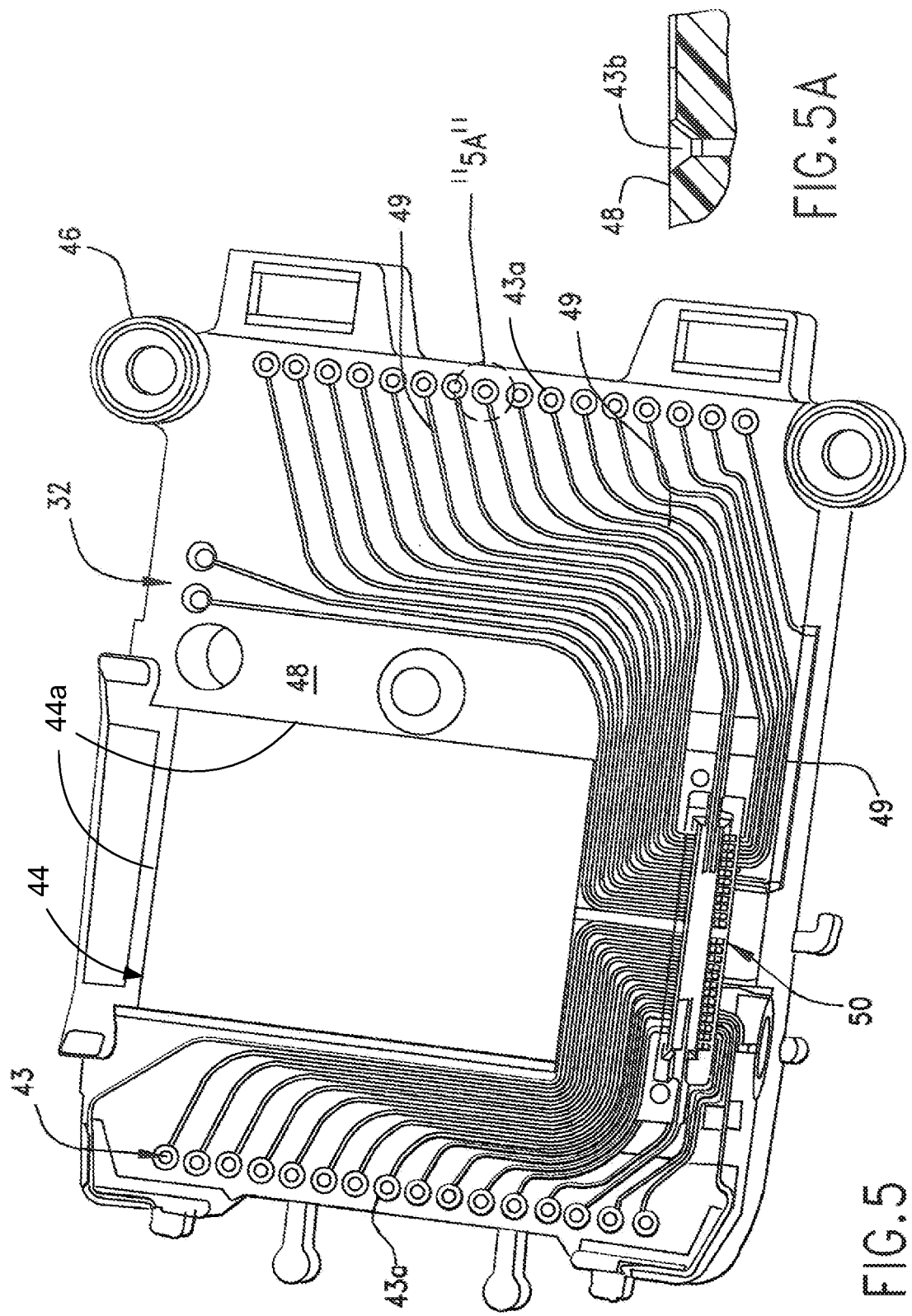
FIG. 5 is a bottom view of the support frame of FIG. 4.

FIG. 5 illustrates the bottom surface 48 of the frame 32 and it can be seen that the bottom surface 48 includes a plurality of conductive traces 49 disposed thereon which extend in preselected paths between a connector element 60 and the tail-receiving slots or openings 43. The "bottom surface 48" is used merely as an example of one surface in the context of the medical device 20 shown and is not intended to be the only surface of the support frame 32 on which traces may be formed in accordance with the invention.

The openings 43 that are formed in the frame 32 are similar to through hole vias that one may find on a circuit board, that is, they have an annular conductive portion 43a (in the form of an open ring) formed integrally with the conductive traces 49 for establishing reliable contact, and preferably these annular rings 43a are themselves recessed, at a slight angle from the surface of the frame 32 as illustrated in FIG. 5a. This defines what may be considered as a "well" area 43b that extends below the level of the bottom surface 48 of the frame and may be filled with solder when the display element 26 is attached to the frame 32.

Figure 6:
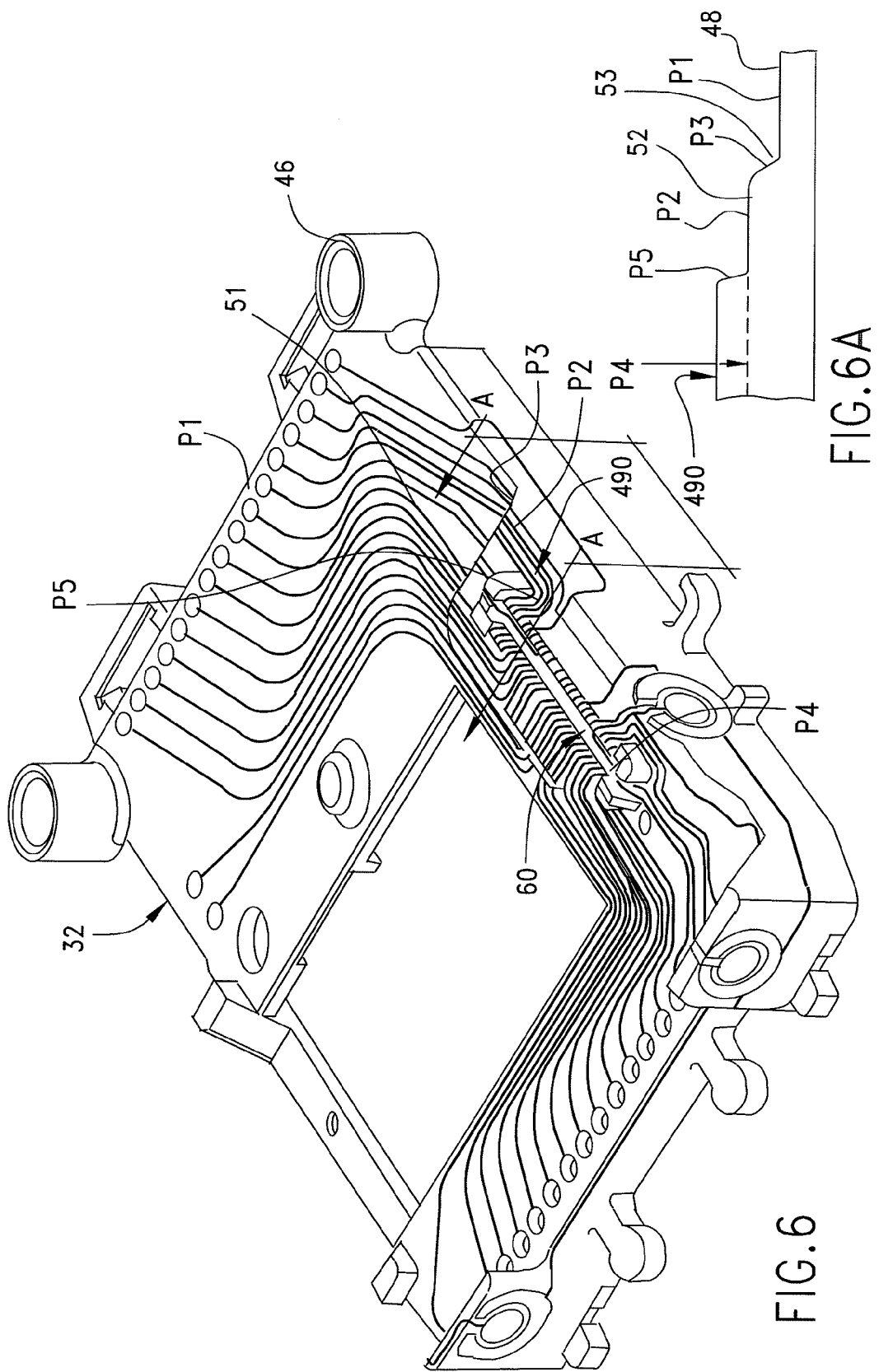
FIG. 6 is a perspective view of FIG. 5 taken from an upper corner thereof which illustrates the switch areas formed as part of the support frame.
Figure 7:
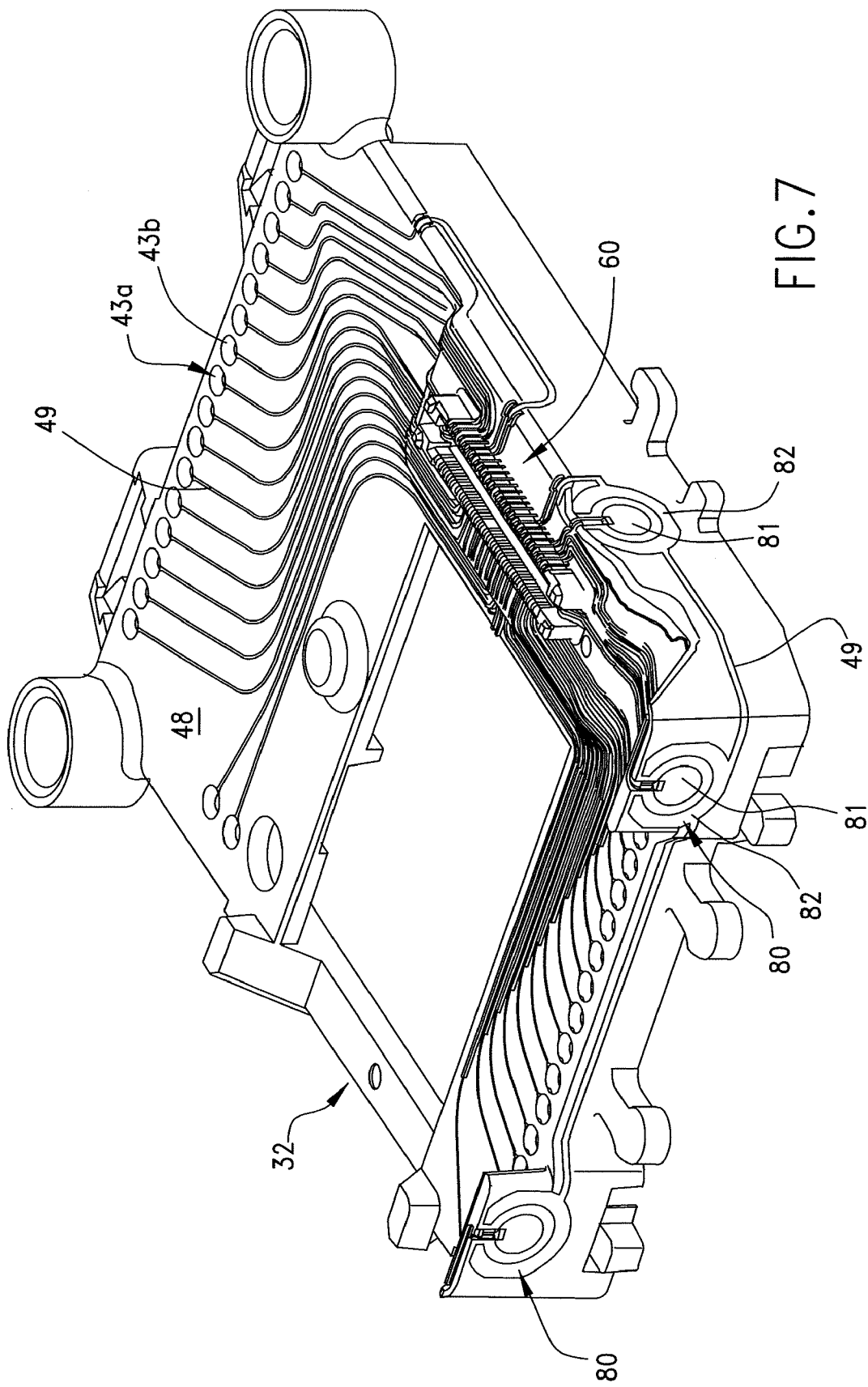
FIG. 7 is a view similar to FIG. 6 and showing the plated conductive traces and their orientation upon the surface of the support frame.

FIGS. 6 & 6A together illustrate the different contours that are present as part of the frame 32. The support frame 32, as shown best in FIG. 6, has a connector area 490 that includes a raised platform 51, somewhat in the nature of a "plateau", that rises above the normal elevation of the bottom surface. It will be understood that the term "rise" is used only in the context of FIG. 6 which shows the frame 32 in an inverted position. When installed in the device the plateau 51 depends downwardly from the body of the frame 32. In any orientation, the platform is spaced apart from the surface of the frame 32. As such, the platform 51 is considered to include a horizontal surface 52 and vertical, or angled, surface 53 that defines a non-planar, path between the frame bottom surface 48 and the platform surface 52. This path may be vertical, or sloped as shown.

FIG. 6A illustrates, diagrammatically, the multiple levels or planes in which the conductive traces 49 extend. The bottom surface 49 of the support frame 32 may be considered to define a first frame, identified as "P1" in the drawings. The connector platform surface 52 is considered to extend in and define a second plane, "P2", while the sloped or angled surface 53 that interconnects the surfaces 48 and 52 together is considered to extend in and define a third plane "P3", which intersects the two planes P1 and P2. The connector element 60 itself defines two additional planes, "P4" and "P5", as will be explained further below. Notwithstanding the path the conductive traces 49 take on the bottom surface in either a linear or non-linear extent, they are all coplanar as long as they extend within plane P1. However, it will be understood that the multiple planes that are defined on the various surfaces of the support frame, define non-linear and non-planar paths for the conductive traces, and what one skilled in the art may consider to be somewhat "tortuous paths".

In a conventional device, the connector element would be separately formed as a connector and would include a plurality of conductive terminals. The connector element would then be mounted to either the support frame 32 or to the circuit board 30 in a separate step. The separate mounting of the connector element adds cost and an extra manufacturing step in incurred in the positioning and attachment of the connector element to the frame. In the present invention, the connector element 60 is advantageously molded as part of the support frame 32, i.e. integrally attached to it. The use of terminals and their costs of stamping and plating are eliminated by conductively and selectively plating portions of the support frame 32 to define the conductive traces 49.

Figure 8:
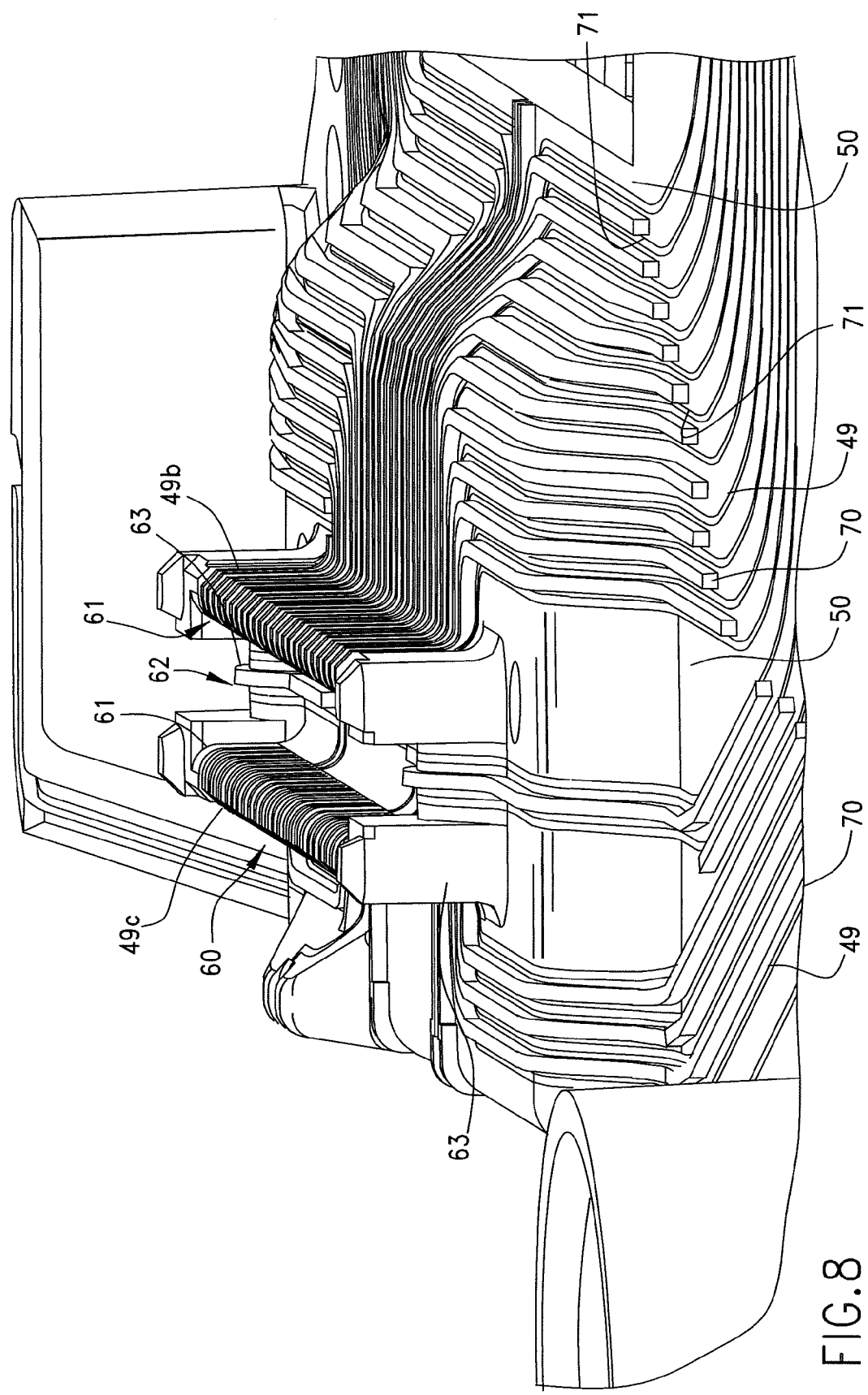
FIG. 8 is an enlarged detail view of the connector area of the support frame illustrating a switch area.

As shown best in FIG. 8, the connector element is shown to be a plug style connector element having a pair of side walls 61 that are spaced apart from each other by a central cavity 62, and which are interconnected at their ends, by end walls 63. A receptacle-style connector element (not shown) will be mounted to the circuit board 30 so that it will engage the connector element 60 of the support frame. In this regard, the connector element 60 includes conductive traces 49*b* and 49*c* that extend across the vertical surfaces of the connector element side walls 61. These traces 49*b*, 49*c* replace conventional metal terminals and thereby assist in the reduction of the overall cost of the integrated assembly. The conductive traces 49 in the connector element may be seen to extend vertically along both surfaces of each of the side walls 61 thereof, and across the top of the side wall. In this path. They extend along two other distinct planes, P4 and P5, that if extended would also intersect with at least one of the support frame surface plane P1 or the connector platform surface plane P2.

Although conductive inks may be used to impose the conductive traces 49 on the support frame, the present invention utilizes a better suited method for doing the same. The conductive traces 49 are formed on the surface of the support frame 32 by first using a laser, preferably an excimer laser, or the like, to selectively break up a nonconductive heavy metal complex previously applied to or embedded in the support frame so that heavy metal nuclei contained in the complex is released along the path of the laser thereby rendering the previously nonconductive area conductive and the area can then be plated using an electroless plating solution. This excitement is also referred to as laser etching in the plating art. An example of one such laser process utilized in plating plastic parts is found in U.S. Pat. No. 6,319,564, issued Nov. 20, 2001 and U.S. Pat. No. 6,696,173, issued Feb. 24, 2004, the disclosure of each of which is hereby incorporated by reference.

In electroless plating, the parts to be plated, in this case, the support frames 32, are dropped into a plating solution. The plating solution is then agitated which is typically accomplished by utilizing a rotating barrel which tumbles the parts around within the plating solution. Problems have been known to occur in such tumbling, because the parts move into and out of contact with each other and these collisions between the parts have been found to produce occasional abrasion of the plated surfaces. In one aspect of the present invention, the surface of the support frame 32 is modified to create a series of ribs 70 formed along, or as part of, the bottom surface 48 of the support frame 32. These ribs 70 extend alongside the conductive traces 49 that are formed on the bottom surface 48 during plating. These ribs 70 are shown in FIG. 8 arranged on opposite sides of the traces 49 and in an alternating fashion where preferably a rib 70 is interposed between each conductive trace 49. The ribs protect the laser-etched areas during plating (as these parts are being tumbled inside a barrel in the electroless bath). Otherwise, the colliding parts can abrade the plated deposits that form the traces as the plating is being applied and this abrasion may sometimes completely remove large enough portions of the plated traces to then possibly create an "open circuit" on the support frame (part) 32 by entirely interrupting the path of the conductive trace 49. The ribs 70 are raised above the surface and will be the point of collisions with other parts in the plating solution and barrel and as such the collisions will abrade any errant plating deposits on the ribs and prevent them from unintentionally bridging two adjacent conductive traces and forming a short circuit on the support frame. The ribs not only protect the traces, but then also provide sacrificial points of contact interposed between adjacent traces.

Figure 9:
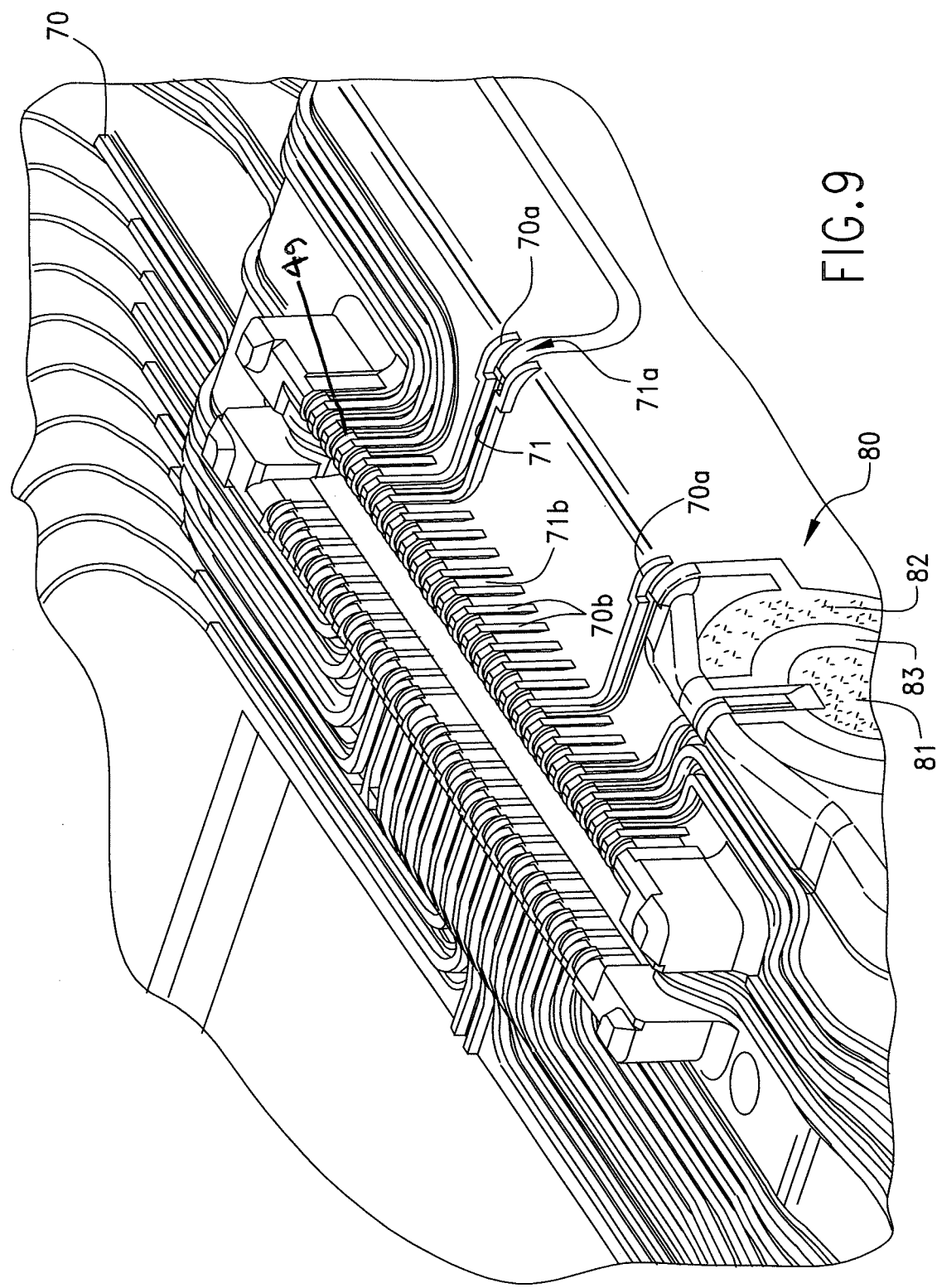
FIG. 9 is a detail view similar to FIG. 8, but taken from a different angle.
Figure 10:
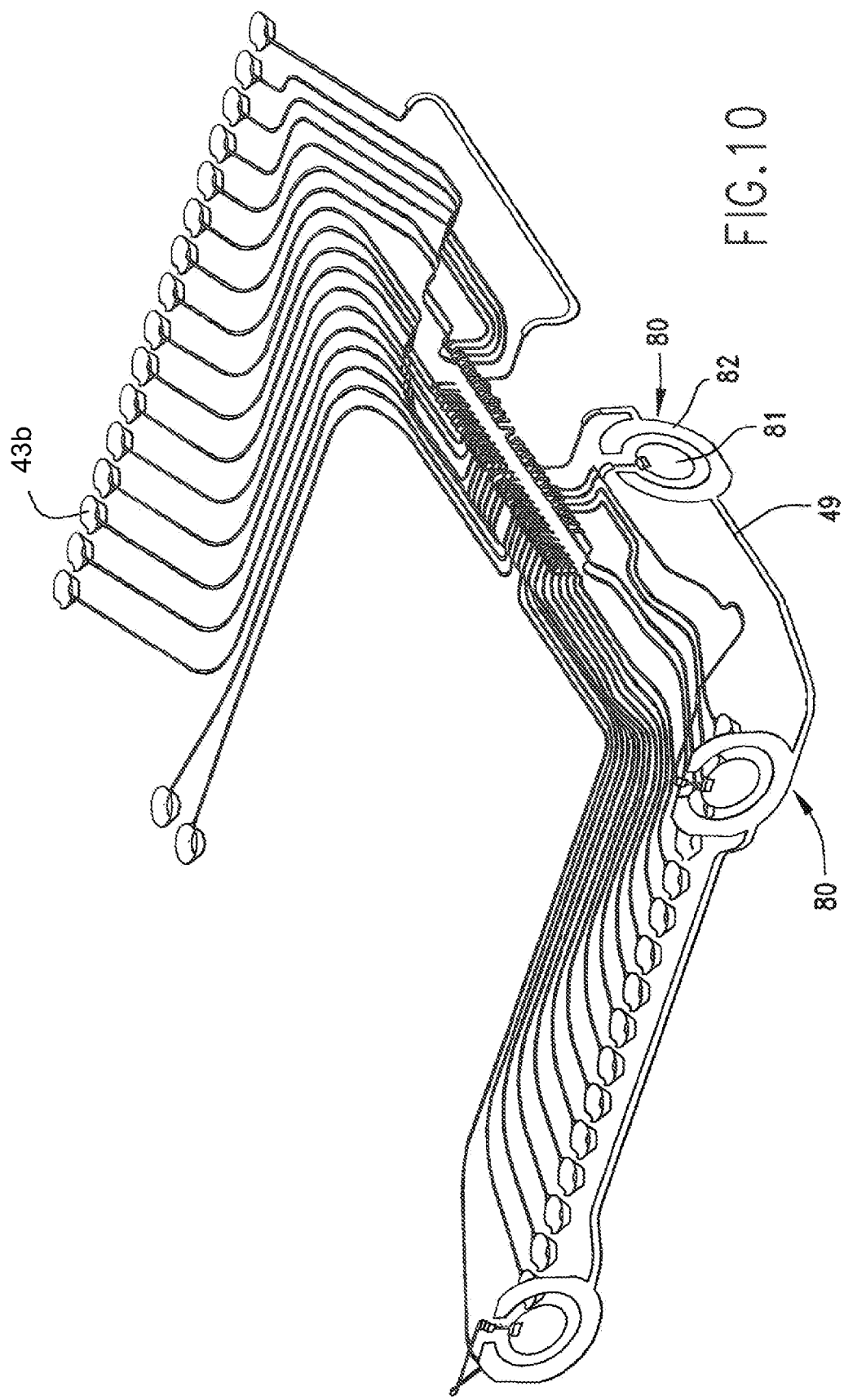
FIG. 10 is a perspective view that isolates the conductive traces.
Figure 11:
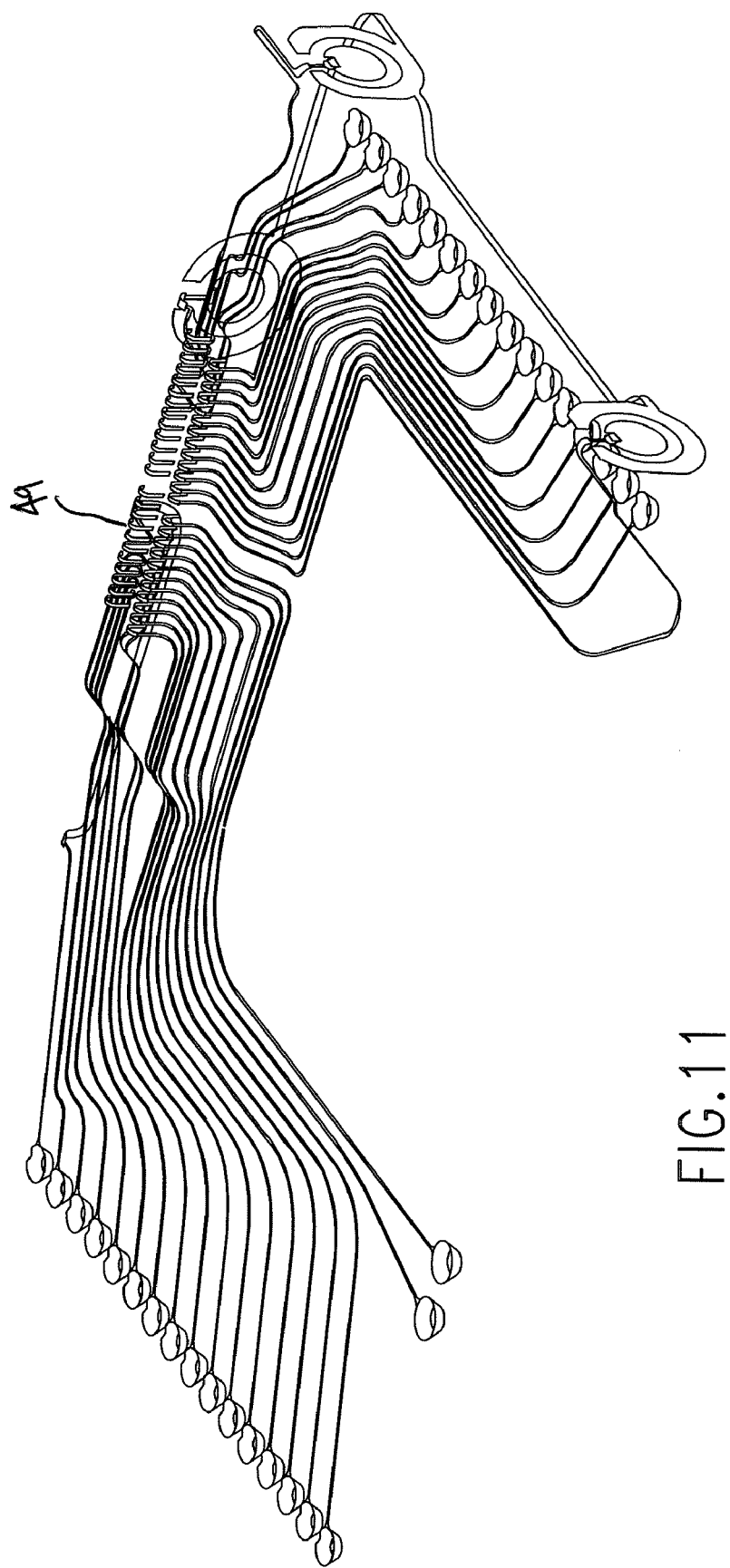
FIG. 11 is a similar view as FIG. 10, but taken from a different angle.

The spacing between the ribs 70 defines a channel 71 and these channels provide flow interruptions to the plating solution so that the plating solution tends to remain longer in the channel areas, partly believed to be caused by both capillary action and the strong surface tension of the meniscus that extends between the channel walls and which reduces the flow of the plating solution therebetween. Thus the plating solution spends more time in contact with the laser-excited areas of the support frame 49 and this delayed time (or increased dwell time) enhances the plating process. In FIGS. 8 and 9, the ribs 70 are shown as rising up from the bottom surface 48 of the support frame 32, but another way to accomplish the same objective is to carve a series of channels into the surfaces. The top surfaces of the ribs 70 are exposed to the abrasion of the tumbling which occurs in the plating and so the plating process ensures that plating solution will not settle on the ribs and render them conductive, notwithstanding their non-excitation by the laser. These raised ribs 70 which protect the conductive traces and serves as pints of abrasion permits the user to increase the agitation speed of the plating bath.

Where one finds extraneous plating deposits occurring, the barrel agitation speed can be increased and this increased speed will promote increased collision between the parts. However, the increased collisions will occur largely along the tops of the ribs. So the abrasion of the traces due to increase in agitation speed is largely eliminated because the ribs protect the traces. Additionally, the increased speed lessens the chance for extraneous plating deposits form settling out of solution on the support frame in un-excited areas and causing short circuits between adjacent conductive traces.

Furthermore, the raised ribs provide other advantages. They are raised with respect to the conductive traces they flank. It is common at times during an LDS process for the laser to heat the support frame and spatter small particles in the area of the support frame surrounding the traces. These spatters can expose the catalyst on both sides of the trace and unduly increase the width of the trace to a dimension unwanted which limits the pitch at which the traces can be separated. The inner walls of the raised ribs capture this spatter and prevent unwanted plating deposits from forming. Additionally, the walls provide a dielectric medium between the traces which may be used to enhance the performance of the circuits in the device by affecting the dielectric strength between adjacent conductive traces.

Figure 12:
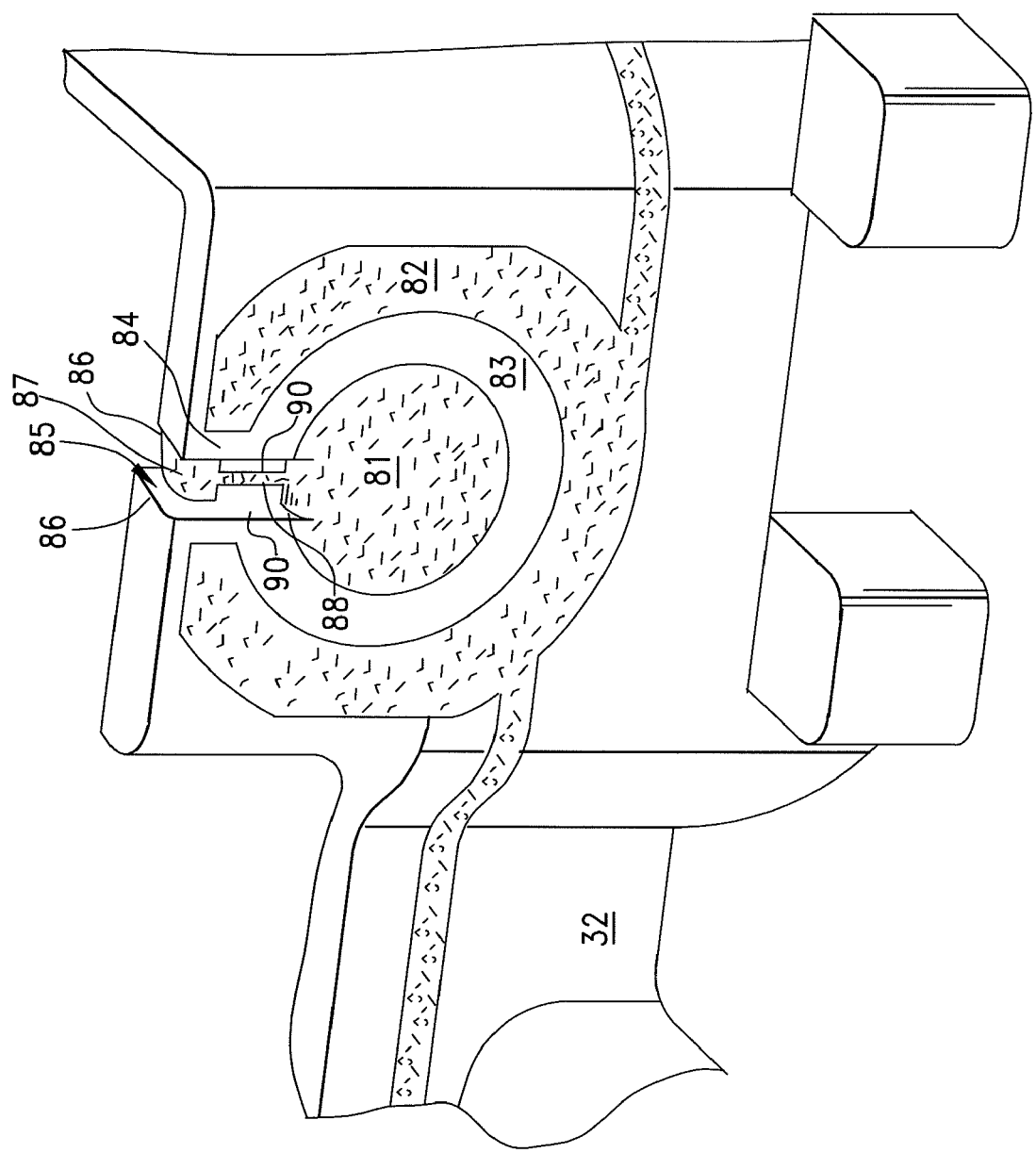
FIG. 12 is an enlarged detail view of the switch dome contact area on the support frame of FIG. 9, taken from a different angle.

The present invention can also be used to provide other integrated aspects to the support frame 32, such as switch bases 80 as shown in FIG. 9 being formed as part of the support frame. As best shown in FIG. 12, the switch base 80 is deposited on the support frame side walls. The switch base includes first and second switch contacts, respectively 91 and 82. One such contact is an inner contact 81 that is surrounded by an interrupted circular con trace that forms the outer contact 82, and the two contacts 81, 82 being separated by an intervening annular non-plated spacing 83. A non-plated area 84 extend through the outer contact 82 and defines a pathway for a connecting trace 87 to extend through and mate with the inner switch contact 81. A physical channel, or slot 85 is preferably formed along this path and the slot has two opposing sidewalls 86 with the trace 87 running therethrough. The trace is necked down in size as at 88 and the sidewalls may preferably include radiused portions 90 that present a curved surface rather than a hard right angle surfaces. These radiused portions 90 will increase the flow of the plating solution through this area. The channel 85 protects the inner trace 86, 88 from the abrasion problems described above.

A conductive membrane 185 may be supported on the device and can be pressed by the user against the side wall of the support frame to bridge the spacing 83 between the two plated switch contact areas 81, 82 to thereby complete that circuit. The use of plated traces in this instance eliminates the use of a separate switch component thereby maintaining the desirable reduced size and cost.

Lastly, use of LDS permits one to form complex shapes with large pads areas that can receive allotments of solder paste for facilitating the connecting of external electronic components to the support frame. Also, the support frame may have, as discussed above integrated connector components 60 formed as integrally therewith. Such a connector component 60 is shown best in FIG. 9, and the conductive traces 49 that extend up and over and into the connector slot between the opposing walls Thereof may include raised ribs 70b which maybe stand alone ribs or ribs associated with other portions 70a of the ribs that are located at radiused edges of the support frame. These ancillary ribs 70a, 70b define ancillary channels 71a, 71b that in which conductive traces extend.

While the preferred embodiment of the invention have been shown and described, it will be apparent to those skilled in the art that changes and modifications may be made therein without departing from the spirit of the invention, the scope of which is defined by the appended claims.

The invention claimed is:

1. A support frame for an electronic device, the support frame having a plurality of distinct surfaces that extend in different planes, the different plans including a first and second plane extending generally parallel to each other and a third plane extending in a direction that intersects the first and second planes, the support frame comprising:
   an opening in the support frame, the opening including a first, second and third side;
   a connector element formed as part of the support frame on the third side, the connector element having at least one wall defining a mating portion of said connector element; and
   a first and second conductive trace disposed on the distinct frame surfaces and extending in a continuous extent between the connector element mating portion and a respective first and second distinct end point on the support frame, the first end point on the first side and the second end point on the second side, the conductive traces extending along non-planar paths, wherein the first distinct end point terminates in a plated well.

2. The support frame according to claim 1, wherein the connector element includes a pair of walls spaced apart from each other, the walls cooperatively defining a receptacle connector on the support frame.

3. The support frame according to claim 1, wherein the first and second planes are horizontal planes and the third plane is angled with respect to the first and second planes.

4. The support frame according to claim 1, further including a connector area formed as part of a raised platform of the support frame.

5. The support frame according to claim 4, wherein the connector element is disposed in the connector area of the support frame and the connector element includes a plurality of walls.

6. The support frame according to claim 1, further including a plurality of raised ribs formed as part of the frame, the ribs being interposed between portions of adjacent conductive traces, pairs of the ribs defining channels that extend lengthwise along portions of the conductive traces.

7. The support frame according to claim 6, wherein each pair of the ribs that forms one of the channels forms an anti-abrasion barrier for the conductive trace contained within the channel.

8. The support frame according to claim 6, wherein at least some of the ribs are disposed on the at least one wall of the connector element.

9. The support frame according to claim 1, wherein said frame includes at least one radiused edge along one of the first and second planes where it intersects with the third plane and the radiused edge includes a pair of spaced apart, raised ribs defining a channel that traverses the edge.

10. The support frame according to claim 9, further including a conductive trace extending through the edge channel.

11. A support frame for an electronic device, the support frame having a plurality of distinct surfaces that extend in different planes including a first and second plane that extend generally parallel to each other and a third plane extending in a direction that intersects the first and second planes the support frame further comprising:
   a connector element formed as part of the support frame, the connector element having at least one wall defining a mating portion of said connector element; and
   a first and second conductive trace disposed on the distinct frame surfaces and extending in a continuous extent between the connector element mating portion and a respective first and second distinct end point on the support frame, the conductive traces extending along non-planar paths;
   at least one switch base integrally formed with the support frame wherein the switch base includes first and second switch contacts and the second switch contact is formed from a conductive trace having the general form of an interrupted circle, the circle having an transverse opening disposed therein and the first switch contact includes a conductive trace that extends through the opening and terminates in a circular pad, the first and second switch contacts being spaced apart from each other by a non-conductive annular spacing.

12. The support frame according to claim 11, wherein the switch base further includes a channel defined in the support frame that extends through the second switch contact opening, the channel including a pair of opposing sidewalls formed in the support frame and the first switch contact conductive trace extending through the channel.

13. The support frame according to claim 12, wherein portions of the opposing sidewalls have a defined radius so as to define curved surfaces at the bottom of the channel.

14. A support; comprising:
   an insulative body portion having a first side and a second side and a first surface and a second surface opposing the first surface and an opening extending between the first surface and the second surface, the opening positioned between the first and second side, the body portion forming a continuous edge around the opening, the first surface being non-planar;
   a first and second conductive trace disposed on the first surface, the first conductive trace having a first proximal end point and a first distal end point and the second conductive trace having a second proximal end point and a second distal end point, the first and second proximal end points being positioned adjacent to each other on a first edge of the opening and the first distal end point being positioned on the first side and the second distal end point being positioned on the second side, the first conductive trace extending along the first surface so as to be non-planar;

a first well positioned at the first distal end, the first well extending below the first surface, the first well being plated and electrically connected to the first conductive trace; and a second well positioned at the second distal end, the second well extending below the first surface and being plated and electrically connected to the second conductive trace.

15. The support of claim 14, wherein the opening is rectangular-shaped.

16. The support of claim 14, wherein the first edge of the opening is one of a plurality of edges and the first conductive trace extends along two edges of the plurality of edges of the opening.

17. The support of claim 16, wherein the second conductive trace extends along two edges of the plurality of edges of the opening, at least one of the two edges that the second conductive trace extends along being a different edge than both of the two edges the first conductive trace extends along.

18. The support of claim 14, further comprising a connector element supported by the body portion, the connector element providing a first and second spaced apart contact, the first contact being electrically connected to the first conductive trace and the second contact being electrically connected to the second conductive trace.

19. The support of claim 14, wherein the first and second well both extends between the first and second surface.

20. The support of claim 14, wherein the body portion includes a first boss and a second boss, the first and second bosses configured, in operation, to help secure the body portion to a support surface.

21. The support of claim 14, wherein the first and second wells are at least partially filled with solder.

22. The support of claim 21, wherein the first and second well are soldered to a secondary component that is supported by the body portion.

23. The support of claim 14, wherein the first and second conductive traces are soldered to a separate connector element.

* * * * *